United States Patent [19]

Zdebel

[11] Patent Number: 4,876,217
[45] Date of Patent: Oct. 24, 1989

[54] METHOD OF FORMING SEMICONDUCTOR STRUCTURE ISOLATION REGIONS

[75] Inventor: Peter J. Zdebel, Mesa, Ariz.

[73] Assignee: Motorola Inc., Schaumburg, Ill.

[21] Appl. No.: 173,482

[22] Filed: Mar. 24, 1988

[51] Int. Cl.[4] .......................................... H01L 21/76
[52] U.S. Cl. .................................. 437/67; 437/33
[58] Field of Search .............................. 437/61, 67, 33

[56] References Cited

U.S. PATENT DOCUMENTS

| | | | |
|---|---|---|---|
| Re. 32,090 | 3/1986 | Jaccodine et al. | 357/55 |
| 4,367,119 | 1/1983 | Logan et al. | 156/643 |
| 4,446,194 | 5/1984 | Candelaria et al. | 428/428 |
| 4,454,647 | 6/1984 | Joy et al. | 29/576 |
| 4,471,525 | 9/1984 | Sasaki | 29/576 |
| 4,492,717 | 1/1985 | Pliskin | 427/96 |
| 4,523,975 | 6/1985 | Groves et al. | 156/643 |
| 4,571,819 | 2/1986 | Rogers et al. | 29/576 |
| 4,582,565 | 4/1986 | Kawakatsu | 156/643 |
| 4,589,193 | 5/1986 | Goth | 29/576 |
| 4,662,064 | 5/1987 | Hsu et al. | 29/591 |
| 4,662,986 | 5/1987 | Lim | 156/643 |
| 4,665,010 | 5/1987 | Herd et al. | 430/330 |
| 4,676,867 | 6/1987 | Elkins | 156/643 |
| 4,676,868 | 6/1987 | Riley et al. | 156/643 |
| 4,689,113 | 8/1987 | Balasubramanyam | 156/643 |
| 4,704,368 | 11/1987 | Goth et al. | 437/60 |

FOREIGN PATENT DOCUMENTS

| | | | |
|---|---|---|---|
| 58-28850 | 2/1983 | Japan | 437/67 |
| 58-98943 | 6/1983 | Japan | 437/67 |
| 59-57449 | 4/1984 | Japan | 437/67 |
| 59-175138 | 10/1984 | Japan | 437/67 |
| 60-132341 | 7/1985 | Japan | 437/67 |
| 60-142535 | 7/1985 | Japan | 437/67 |
| 60-236244 | 11/1985 | Japan | 437/67 |

OTHER PUBLICATIONS

A. Schiltz et al., "Two-Layer Planarization Process", J. Electrochem. Soc.: Solid State Science and Technology, vol. 133, No. 1, pp. 178-181, Jan. 1986.

*Primary Examiner*—Olik Chaudhuri
*Attorney, Agent, or Firm*—Harry Wolin; Robert Handy

[57] ABSTRACT

A planarized dielectric isolation region for semiconductor devices and integrated circuits is created by providing a semiconductor substrate, providing on the substrate an oxide/nitride mask with an opening for defining the isolation region and a closed portion for defining the desired semiconductor islands, anisotropically etching a trench into the semiconductor substrate, isotropically etching the substrate so as to slightly undercut the oxide/nitride mask, thermally oxidizing the substrate to form a thin oxide layer on the bottom and sidewall of the trench wherein the outer surface of the thermal oxide approximately lines up with the edge of the oxide/nitride mask at the top of the trench sidewall, filling the trench with a conformal deposited material (preferably a dielectric), providing a mask over the conformal material which is the complement to the trench etch or island mask but of smaller lateral dimensions so as to cover those portions of the conformal layer which do not rise up over the semiconductor island, etching away the exposed portions of the conformal material to a level approximately co-planar with the island surface and the portion of the conformal material under the mask, and removing the mask.

7 Claims, 3 Drawing Sheets

METHOD OF FORMING SEMICONDUCTOR STRUCTURE ISOLATION REGIONS

BACKGROUND

1. Field of the Invention

This invention relates to the fabrication of electronic devices and, more particularly, to the fabrication of planarized isolation regions for separating semiconductor regions in devices and integrated circuits.

Co-pending U.S. patent application Ser. No. 173,481 by P. Zdebel et al., entitled "Planarization of Semiconductor Devices Having Surface Protrusions of Varying Width and Separation" (hereafter Zdebel-I) is related.

2. Background Art

It is well known in the semiconductor art to provide dielectric regions in semiconductor substrates for electrical isolation. Dielectric isolation is used to reduce interaction and parasitic capacitance between adjacent semiconductor regions and to reduce parasitic capacitance between the semiconductor substrate and overlying conductors used for interconnection purposes.

Silicon is the most commonly used semiconductor and silicon oxide is the most commonly used isolation dielectric because of its excellent compatibility with silicon. However, other semiconductors and isolation dielectrics are also used. The terms "dielectric isolation" and "oxide isolation" are employed herein to refer generally to isolation regions which comprise an electrical insulator. The isolation region may be entirely of a dielectric or may be a combination of a dielectric and a conductor, as for example a dielectric liner or sidewall with a polycrystalline semiconductor core.

For convenience of explanation, the invention is described using silicon as an exemplary semiconductor material. However, this is not intended to be limiting and those of skill in the art will appreciate that other semiconductors (e.g., III-V's, II-VI's) can also be used. Those of skill in the art will also appreciate that many different dielectrics can be used, of which oxides, nitrides, oxy-nitrides, and layered structures are examples. Silicon oxide, silicon nitride and combinations thereof are preferred dielectrics.

When dielecric isolation is employed to create isolated semiconductor device islands, it is desirable that the isolation regions have as planar a surface topology as possible so that further processing needed to form the desired devices and interconnections may be readily carried out. An important requirement is that the isolation process induce as few defects as possible in the semiconductor islands so as to minimally affect the semiconductor properties (e.g., carrier lifetime, recombination velocity, mobility, etc.) and resulting device properties. A further requirement is that the isolation process be as simple as possible so as to promote high yield and low manufacturing cost.

A wide variety of oxide isolation processes are known, as for example, LOCOS (Local Oxidation Of Silicon) and ROI (Recessed Oxide Isolation). However, these and other prior art isolation processes suffer from a number of well known limitations which become increasingly severe as one attempts to construct devices and circuits of ever greater complexity, packing density, and performance. As critical device dimensions are reduced it is found, for example, that such prior art processes do not scale in proportion to the device scaling and, among other things, lead to an increased proportion of wasted chip area. Such processes often lead to undesirable "bird's beaks" in the wafer surface where the isolation region meets the semiconductor island. Further, such processes can also cause powerful residual stresses in the semiconductor island. These effects degrade performance and increase cost.

Accordingly, it is an object of the present invention to provide an improved means and method for forming dielectric isolation regions in semiconductor substrates wherein the isolation regions are planarized with respect to the semiconductor surface.

It is a further object of the present invention to provide such planarized dielectric isolation regions while minimizing defect formation in the semiconductor islands being isolated.

It is another object of the present invention to provide such planarized dielectric isolation regions and minimum defect formation in the semiconductor islands being isolated while maintaining precise dimensional control of the isolation regions and semiconductor islands.

It is a further object of the present invention to provide such planarized dielectric isolation regions while minimizing defect formation in the semiconductor islands being isolated using a process which is both simple and highly compatible with other process steps to improve manufacturability and reduce cost.

It is another object of the present invention to provide such planarized dielectric isolation regions and minimum defect formation in the semiconductor islands being isolated using a process employing comparatively short times at elevated temperatures, i.e., small Dxt (Diffusivity x time) product so as to minimize adverse impact on previously doped device regions.

As used herein, the words "planarized" or "planarization" are intended to refer to structures which have a substantially smooth upper surface, substantially free of abrupt steps, protrusions or depressions, and where the height of any residual abrupt surface features or steps is small compared to the thickness of subsequent layers intended to bridge or fill such features or steps. While it is desirable that the planarized surface also be substantially flat, smoothness is more important than flatness and absolute flatness is not required.

SUMMARY OF THE INVENTION

These and other objects and advantages are obtained through the present invention wherein one or more trenches are etched in a semiconductor substrate using a selective anisotropic etch through an isolation mask applied to the substrate surface leaving undisturbed semiconductor islands therebetween. A low temperature material, e.g., a dielectric, is conformally applied to fill the trenches about to the level of the semiconductor islands and to extend over the semiconductor islands. A planarizing etch mask having closed regions corresponding to the shape of the trenches but laterally smaller by a predetermined amount is applied to the conformal material. The closed regions cover the portion of the conformal material in the trenches having a thickness about equal to the trench depth. The open regions of the planarizing mask leave exposed those portions of the conformal material over the semiconductor islands and at the periphery of the trenches where the conformal layer rises up along the trench sidewall and has a thickness exceeding the trench depth. The exposed material is etched to the level of the semiconductor islands.

It is desirable to perform a brief isotropic etch of the substrate after the anisotropic trench etch and before depositing the conformal material so as to slightly undercut the isolation mask. In a preferred embodiment, a thin thermal oxide layer is then grown on the bottom and sidewall of the trench. The thickness of this thermal oxide is desirably adjusted so that the outer surface of the thermal oxide lines up with the edge of the isolation mask at the top of the trench sidewall. This protects the edge of the semiconductor island during subsequent etching of the trench filling material.

It is further desirable that the planarizing etch mask have as large a differential etch ratio as possible compared to the trench filling material. Where the trench filling material is polycrystalline semiconductor then the planarizing etch mask is desirably oxide or nitride or combinations thereof, and where the trench filling material is oxide or nitride or combinations thereof, the planarizing mask is desirably a polycrystalline semiconductor, as for example, polysilicon. Resists may also be used alone or in combination with the hard masks.

DETAILED DESCRIPTION OF THE FIGURES

In the description that follows and in FIGS. 1–16, certain regions are identified as being of particular material, conductivity and/or type. However, this is merely for convenience of explanation and not intended to be limiting. Those of skill in the art will understood based on the description given herein that various semiconductor and dielectric materials can be used and that the doping of various regions of the semiconductor substrate may be altered in order to obtain different device functions. Further, various examples of layer thicknesses and the size of typical regions are given for the case where a bipolar transistor suitable for use in advanced IC's is being formed, but these are merely as an aid to comprehension and it will be understood by those of skill in the art that these dimensions may be scaled to larger or smaller sizes to achieve different devices and functions. Those of skill in the art will understood how such variations may be made based upon the present description and well known principles.

Figure 1:
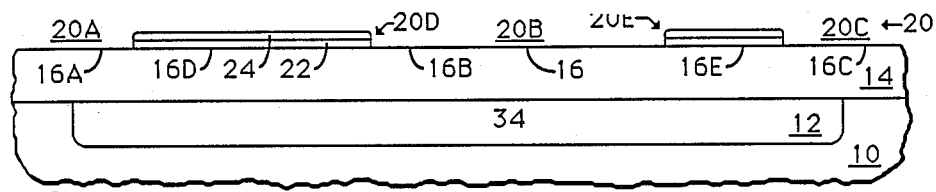
FIGS. 1–14 show simplified schematic cross-sectional views of a portion of a semiconductor substrate during different stages of fabrication and according to the present invention.

FIGS. 1–14 illustrate simplified cross-sections of a portion of a semiconductor substrate at different stages of fabrication according to a preferred embodiment of the present invention. Referring initially to FIG. 1, semiconductor substrate 10 (e.g., P or P− silicon), has therein buried layer 12 (e.g., N+) above which is formed semiconductor region 14 (e.g., N-epi) having surface 16. Layers 12 and 14 are typically in the range of a few tenths of a micrometer to a few micrometers in thickness, with about 0.6 to 0.9 micrometers being typical and about 0.7 micrometers being convenient for high performance bipolar IC's. Means for forming such layers and regions are conventional and well known in the art.

Surface 16 has thereon hard mask 20 having open regions 20A–C over semiconductor surface portions 16A–C and closed regions 20D–E over surface portions 16D–E. Closed regions 20D–E correspond to the locations where semiconductor islands are desired for construction of devices, e.g., transistors, resistors and the like, and open regions 20A–C correspond to the location of the dielectric isolation regions intended to separate the semiconductor islands. The semiconductor islands can have lateral dimensions typically in the range of a few micrometers to several thousand micrometers or more. For example, with bipolar devices used in complex IC's, semiconductor islands having lateral dimensions of two to five micrometers are common and there is great interest in even smaller lateral dimensions.

It is essential that mask 20 be resistant to materials that etch semiconductor 14 so as to protect surface portions 16D–E while trenches are formed in surface portions 16A–C of semiconductor 14 under openings 20A–C. It is desirable that mask 20 also be resistant to oxidation. Such mask materials are well known in the art. Mask 20 is conveniently formed from silicon oxide layer 22 and silicon nitride layer 24 but other materials having the above-described properties may also be used. Layer 22 is typically thermally grown silicon dioxide having a thickness in the range of 0.02–0.2 micrometers with about 0.07 micrometers being typical. Layer 24 is typically silicon nitride formed by CVD, LPCVD, PECVD, sputtering or other processes well known in the art and with thickness in the range of about 0.06–0.6 micrometers with about 0.3 micrometers being convenient. Means for etching layers 22, 24 to form openings 20A–C are well known in the art.

Figure 2:
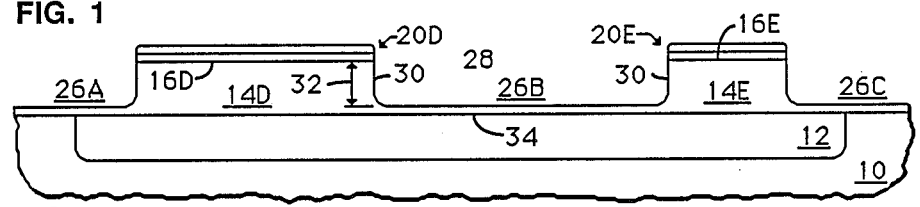

Portions 16A–C of surface 16 of semiconductor 14 are etched through opening 20A–C to form trenches 26A–C, respectively, having bottom 28 and sidewall 30 extending from bottom 28 to surface 16 (see FIG. 2). Bottom 28 is at depth 32 from surface 16 and preferably slightly above interface 34 between buried layer 12 and epi-layer 14. It is desirable that trenches 26A–C be formed by anisotropic etching of semiconductor 14 so that there is little or no undercutting of the edges of closed regions 20D–E of mask 20. Means for anisotropic etching of semiconductor materials to produce trenches whose sidewalls descend substantially vertically or taper inwardly from the mask edges (rather than being undercut under the mask edges) are well known in the art.

Figure 3:
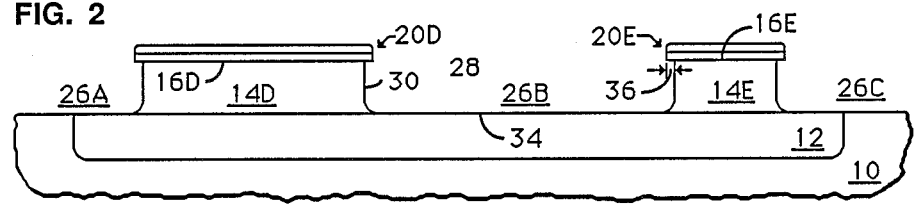
Figure 4:
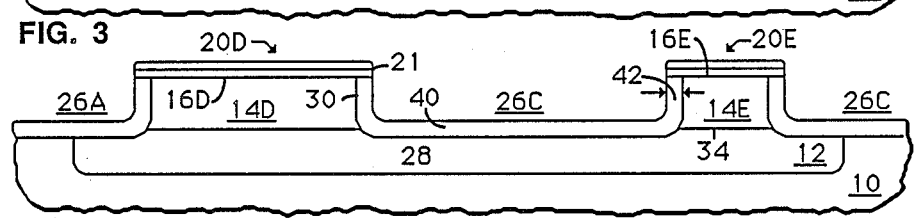

It is not necessary that the trench etching be perfectly anisotropic, i.e., zero undercutting, since a controlled amount of undercutting is desirable. However, this is most conveniently obtained by using a highly anisotropic vertical etch to remove most of the material needed for the trench followed by a brief etch that is less anisotropic or is isotropic, as for example a wet etch, to provide a controlled amount of undercutting. The result is shown in FIG. 3 where sidewall 30 and bottom 28 have been isotropically etched to locate sidewall 30 under the edge of closed portions 20D–E of mask 20 by small amount 36. At the same time, bottom 28 moves slightly deeper into layer 14, and may arrive at intersection 34. This is desirable for many device structures so that there is little or no lightly doped material (e.g., N−) under trench 26A–C and therefore less chance of a parasitic buried inversion layer or channel.

Undercut amounts in the range of a few hundredths to a few tenths of a micrometer are suitable with about 0.05-0.1 micrometers being typical. More generally, it is desirable that undercutting amount 36 (or dielectric thickness 42 in FIG. 4) be five to ten percent or less of the lateral dimension of the smallest semiconductor island.

Next (see FIG. 4), thin conformal dielectric 40 of thickness 42 is provided on sidewall 30 and bottom 28 of trenches 26A-C. Layer 40 protects sidewall 30 of semiconductor islands 14D-E from attack during subsequent etching steps associated with planarizing the material used to fill trenches 26A-C and is an important feature of the present invention.

Layer 40 is conveniently provided in the case of oxidizable substrates, for example, by thermal oxidation of the exposed semiconductor, however, conformal coating techniques well known in the art can also be used. Layer 40 desirably has thickness 42 such that outer surface 44 of layer 40 substantially aligns with edge 21 of closed portions 20D-E of mask 20. Where thermal oxidation is used to produce dielectric layer 40 then some of the semiconductor on sidewall 30 and bottom 28 is consumed during growth of layer 40 and thickness 42 of layer 40 will exceed undercut amount 36. The ratio of amount 42 divided by amount 36 may be readily determined from the amount by which the grown oxide exceeds in volume the substrate material consumed in forming the oxide. This ratio is well known in the art for different material combinations or is readily determinable without undue experimentation. For example, where semiconductor 12, 14 is of silicon and undercut amount 36 is, say, about 0.05 micrometers, then thickness 42 of layer 40 produced by thermal oxidation of semiconductor 12, 14 is about 1.0 micrometers.

Where thermal oxidation is used to provide layer 40, as for example with silicon, this is the only high temperature (i.e., >900° C.) step in the isolation process and, since layer 40 is comparatively thin, only a short time is required to provide the needed thickness. Thus, the Dxt (Diffusivity x time) product is inherently small and there is minimal impact on any previously doped regions of the semiconductor. The Dxt product associated with the isolation process may be reduced further by using high pressure oxidation to form layer 40, since this permits the oxidation temperature to be lowered even further, e.g., to the range 700°-900° C. where diffusivity of most dopants of interest for semiconductor device fabrication is very small.

It is often desirable to provide regions of enhanced doping (e.g., P+) in the bottom of one or more of trenches 26A-C to act as channel stops. These regions are omitted from FIGS. 1-16 for simiplicity, however, those of skill in the art will understand that such channel stop regions may be included. They may be provided prior to growth of epilayer 14 or afterwards, for example, during the stages represented by any of FIGS. 1-14. Ion implantation is a convenient method for providing such channel stops. Where ion implantation is to be used, channel stop doping is conveniently provided at stages in the process where relatively small amounts of material must be penetrated so as to permit lower implant accelerating voltages to be used, as for example, during the stages of FIGS. 2-4. If provided during the stage represented by FIG. 4, then dielectric 40 conveniently acts as a protective implant screen. However, channel stop doping may also be provided during the stages represented by FIGS. 1 or 12-14.

Figure 5:
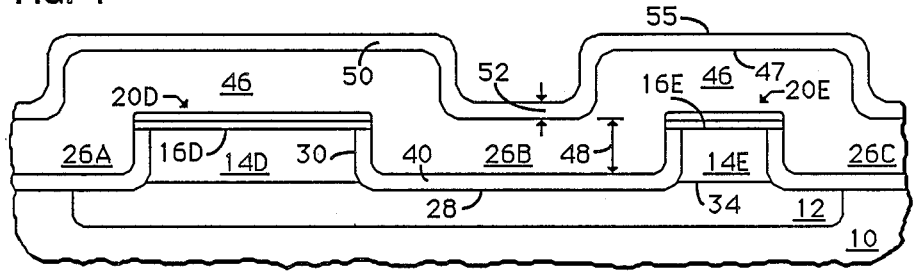

Following formation of layer 40, conformal layer 46 is provided to fill trenches 26A-C (see FIG. 5). Layer 46 has thickness 48 chosen to at least fill trenches 26A-C about to the level of surface 16 and preferably at least to the level of dielectric layer 22 or 24 (e.g., about 0.7-0.8 micrometers for the typical layer thicknesses given here). Layer 48 is conveniently formed by CVD, LPCVD or PECVD with LPCVD being preferred. In general, these processes are carried out at temperatures less or equal those required to form layer 40 and for relatively short times, so that deposition of layer 46 has negligible effect on the Dxt product.

Layer 46 may be a dielectric or a conductor, as for example, polysilicon, but dielectric is preferred because it provides lower parasitic capacitance. Silicon oxide, silicon nitride or combinations thereof are examples of suitable dielectric materials for layer 46. It is important that layer 46 be differentially etchable with respect to layer 24 over semiconductor islands 14D-E. Both polysilicon and silicon oxide satisfy this requirement where layer 24 is of silicon nitride.

Since layer 46 is conformal it coats the entire structure including trenches 26A-C and semiconductor islands 14D-E, following the contours of the surface with substantially equal thickness. This gives the structure shown in FIG. 5.

Layer 46 is conveniently covered with differentially etchable masking layer 50 of thickness 52 which will later serve as a hard mask. Layer 50 is desirable but not essential. Layer 50 may be a semiconductor or a dielectric or a metal, or combinations thereof since its only function in the process is to serve as a mask and it is later entirely removed. Where layer 46 is a dielectric, such as for example, silicon oxide or silicon nitride or combinations thereof, polysilicon is particularly convenient for layer 50. A polysilicon thickness of about 0.2-0.5 micrometers is suitable with about 0.3 micrometers being convenient. Where layer 46 is of silicon oxide or polysilicon, then silicon nitride is an example of another material suitable for layer 50. Layer 50 is conveniently deposited conformally but this is not essential. CVD and LPCVD are convenient deposition techniques well known in the art.

Figure 6:
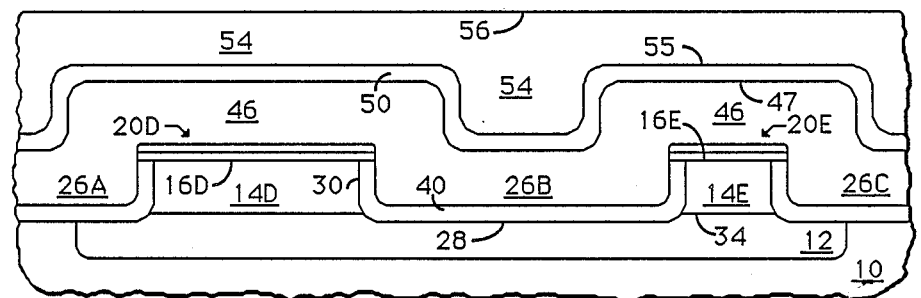

The structure of FIG. 5 is then covered with comparatively thick masking material 54, as for example, a photoresist or glass. The result is shown in FIG. 6. Layer 54 is conveniently spun on so as to substantially planarize the structure, but this is not essential. Further details concerning such planarizing materials and masking techniques is provided in co-pending related patent application Zdebel-I, ibid, which is incorporated herein by reference. It is desirable that layer 54 have sufficient thickness to at least fill the depressions in layers 46, 50 above trench regions 26A-C. In this situation upper surface 56 of layer 54 is at or above upper surface 55 of layer 50 above semiconductor islands 14D-E, or at or above upper surface 47 of layer 46 where optional layer 50 is omitted. Photoresist is particularly convenient for layer 54 because it eliminates the need for another photosensitive mask thereover.

Figure 7:
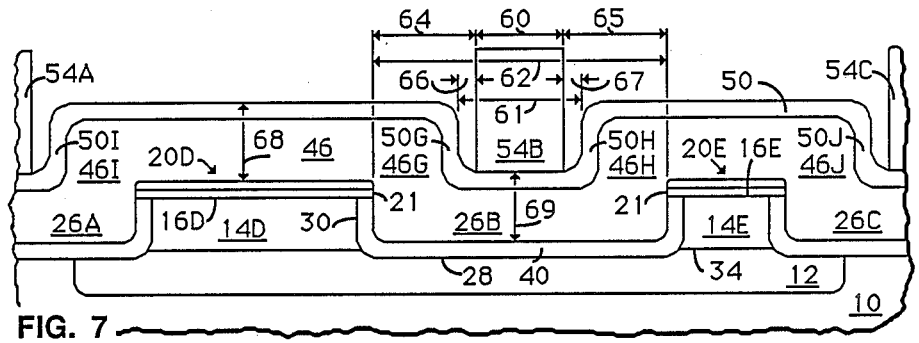
Figure 16:
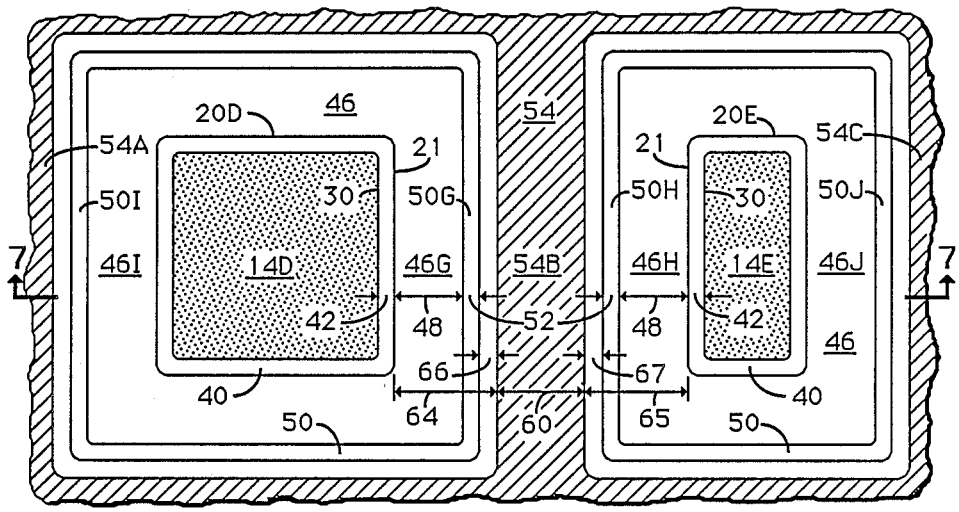
FIG. 16 shows a simplified composite top view of the portion of the semiconductor substrate of FIGS. 7 illustrating the relative lateral position of the several layers and masks used.

Using means well known in the art, layer 54 is etched to leave regions 54A-C corresponding to regions 26A-C, but of narrower lateral dimensions (see FIGS. 7 and 16). For example, region 54B of lateral width 60 is provided above trench 26B of lateral width 62 between mask edges 21 and lateral width 61 between portions 50G-H of layer 50 where layer 50 rises up to extend conformally over semiconductor islands 14D-E (or between portions 46G-H where layer 50 is not used). Region 54B is separated from edges 21 of mask portions 20D-E by amounts 64, 65 and from portions 50G-H of layer 50 (or 46G-H of layer 46, if layer 50 is omitted) by gaps 66, 67. It is important that width 60 of region 54B be less than width 61 between portions 50G-H of layer 50 (or between 46G-H of layer 46 where layer 50 is not used), otherwise a large height bump will exist in portion 54B where any portion thereof extends over portions 50G-H or 46G-H. Such height bump should be avoided.

FIG. 16 provides a simplified composite top view of the structure of FIG. 7 showing the lateral arrangement of mask portions 54A-C relative to semiconductor islands 14D-E, masks 20D-E and mask edges 21, layer 40 on sidewalls 30, regions 46G-J and 50G-J where they rise up to pass over sidewalls 30, and gaps 66, 67. For ease of understanding, regions 54A-C are hatched and semiconductor islands 14D-E are stippled. It will be appreciated based on the description herein that the shape of mask regions 54A-C is complementary to the shape of mask regions 20D-E (and semiconductor islands 14D-E) and that lateral separation 64, 65 between mask region 54B, for example, and mask regions 20D-E is determined by the sum of the thicknesses 42 (of layer 40), 48 (of layer 46) and 52 (of optional layer 50) plus gaps 66, 67 and that these dimensions can be carefully and conveniently controlled during fabrication. Additional details on how mask 54A-C may be derived from mask 20D-E are given in co-pending application Zdebel-I, ibid. Since layers 46, 50 are conformal, thickness 68 above semiconductor islands 14D-E and thickness 69 above trenches 26A-C are substantially equal.

Figure 8:
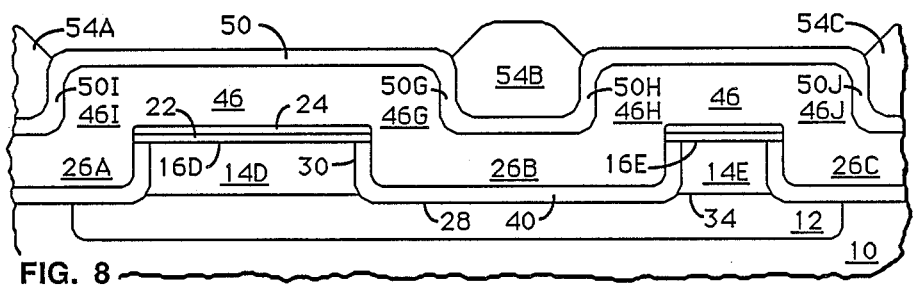

Gaps 66, 67 may be filled by applying another planarizing layer as illustrated for example in the copending application Zdebel-I or, as is illustrated here, by heating slightly to allow, for example, portion 54B to flow so that it fills width 61 without any height bump above portion 46G-H. Either method works. The result is illustrated in FIG. 8. As those of skill in the art will appreciate, other techniques for filling gaps 66, 67 may also be used so long as they do not allow mask portion 54B to extend over portion 46G-H since this would tend to mask part of portion 46G-H adjacent portions 50G-H from etching could and result in an undesirable dielectric spike being left along the sides of portions 50G-H.

As those of skill in the art will appreciate based on the foregoing discussion, analogous conditions exist with respect to mask portions 54a and 54C within trenches 26A and 26C, and portions 46I and 46J, respectively.

Where optional layer 50 is used, the structure of FIG. 8 is etched so as to remove those portions of layer 50 not protected by mask portions 54A-C. The etch should attack the material of layer 50 at a faster rate than the material of layer 46 or mask 54. Suitable etchants are well known in the art. This produces the result shown in FIG. 9 wherein upper surface 47 of layer 46 is exposed between regions 54A-C. Portions 50G-J of layer 50 still remain.

Figure 9:
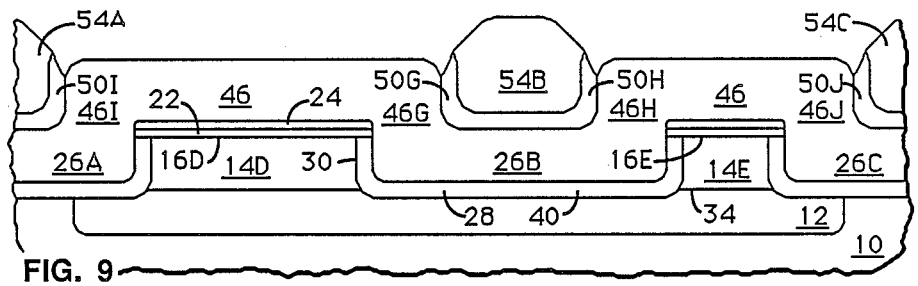
Figure 10:
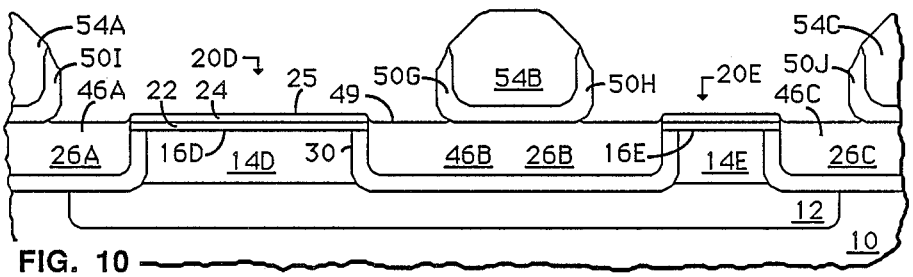

Next the structure of FIG. 9 is subjected to an etch which preferentially attacks the material of layer 46, i.e., etches the material of layer 46 at a faster rate than it etches the material of layer 50. Suitable etchants are well known in the art. This etching step is carried on until those portions of layer 46 above surface 49 (see FIG. 10) have been removed. Surface 49 is approximately level with the top of layer 22. In this process, the portions of layer 46 above islands 14D-E are completely removed and the thicker parts of layer 46 in portions 46G-J are reduced in thickness to about the thickness of the part of layer 46 under mask portions 54A,C and about level with the upper surface of layer 22. Mask portions 54A-C and portions 50G-J of layer 50 are then removed, leaving the structure shown in FIG. 11. Note that by slightly adjusting the initial thickness and etch back of layer 46, surface 49 may be lined up with surface 16 or the upper surfaces of either layer 22 or 24. Since layers 22 and 24 are comparatively thin, great precision is not required, and the foregoing process provides surface 49 on portions 46A-C of layer 46 in trenches 26A-C, respectively, which is approximately planarized with repsect to surface 25 of layer 24 above semiconductor islands 14D-E.

Figure 11:
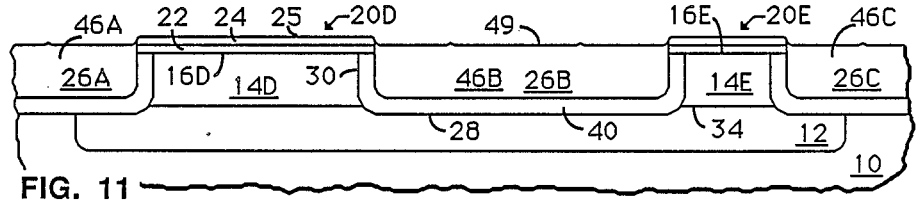

The structure of FIG. 11 may be used directly for fabrication of various transistors. The presence of etch and oxidation resistant layer combination 22, 24 above semiconductor islands 14D-E is particularly convenient since it provides a layer configuration frequently needed for self-aligned "master mask" type device fabrication procedures. See for example, U.S. Pat. No. Re. 30,282, 4,199,380 and 4,443,932 which describe master mask fabrication procedures for IC's. However, as illustrated in FIGS. 12-14, further processing may be used prior to embarking on device fabrication.

Figure 12:
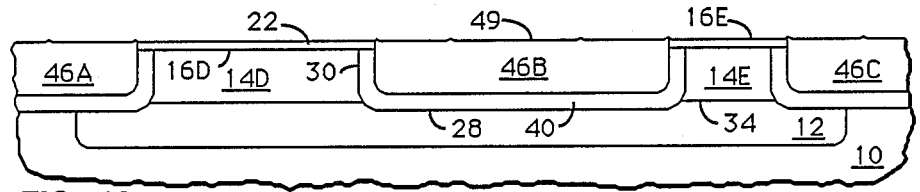
Figure 13:
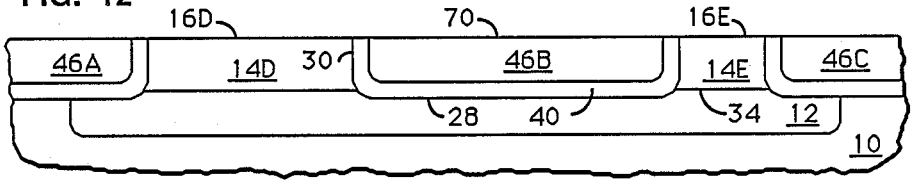

In FIG. 12, oxidation resistant layer 24 has been removed by differential etching. In FIG. 13, the resulting structure has been etched to remove underlying layer 22. At the same time, surface 49 is also slightly etched to the level of surface 70 which is substantially planarized in this example with respect to surfaces 16D-E of semiconductor islands 14D-E.

Figure 14:
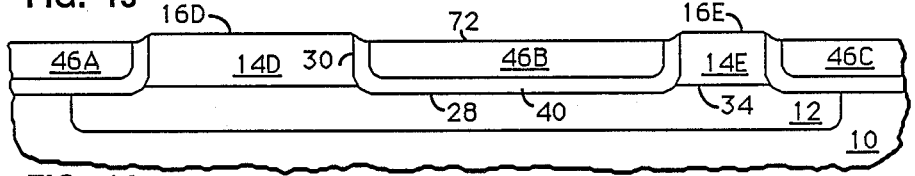

FIG. 14 illustrates the situation when portions 46A-C are overetched, as for example due to imperfect etch uniformity across a wafer or from wafer to wafer in a batch. Layer 40 of, for example, thermal oxide protects sidewall 30 of islands 14D-E from exposure to the etchants during over-etching of isolation portions 46A-C in trenches 26A-C. If the over-etch occurs while nitride layer 24 is still present on islands 14D-E, as for example during the anisotropic etch to remove portions 46G-J, then sidewalls 30 are protected by the combination of the overhanging edge of layer 24 extending beyond sidewall 30 and layer 40. If layer 24 has already been removed, as for example at the step of FIG. 12, the portion of layer 40 along sidewall 30 continues to protect sidewall 30. This is because the preferred thermal oxide of layer 40 has a lower etch rate than the deposited oxide used, for example, for layer 46 and therefore etches more slowly. This keeps sidewall 30 covered even while portions 46A-C are etched below the level of surfaces 16D-E.

Protecting sidewalls 30 from the effects of imperfect etching is an important feature of the present invention since it reduces the likelihood that defects or spurious channels will form on the sidewalls of semiconductor islands 14D-E. This greatly improves manufacturability of the devices subsequently formed in the islands. Also the protection of sidewall 30 is especially important where, for example, polysilicon is used for the material of layer 46, or more generally, where layer 46 and islands 14D-E are of the same material. In this case sidewall 30 is attacked by the etchants used for layer 46, and layers 22 or 24 and 40 prevent substantial undercutting into semiconductor islands 14D-E from any over etching of layer 46.

Figure 15:
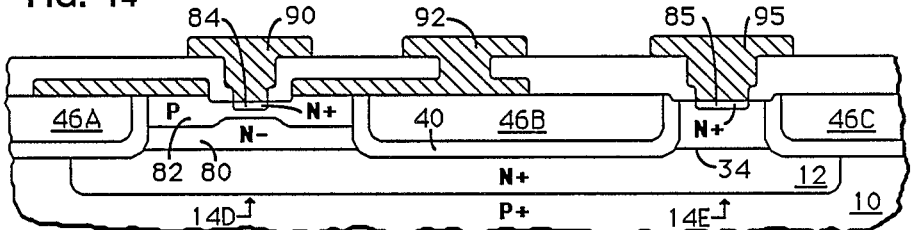
FIG. 15 shows the semiconductor substrate of FIG. 14 after further processing to produce a semiconductor device therein.

FIG. 15 illustrates the result of taking the structure of FIG. 13 and subsequently forming a bipolar transistor therein. Techniques for forming bipolar transistors are described for example, in U.S. Pat. No. 4,837,176 by Zdebel et at., entitled "Integrated Circuit Structures Having Polycrystalline Electrode Contacts and Process." However, other techniques can also be used.

Referring now to FIG. 15, collector region 80 (e.g., N—), base region 82 (e.g., P) and emitter region 84 (e.g., N+) are formed in semiconductor island 14D and collector contact regions 81 (e.g., N) and 85 (e.g., N+) are formed in semiconductor island 14E. Emitter region 84 is contacted by conductor 90, base region 82 is contacted by conductor 92 and collector contact region 85 is contacted by conductor 95, using means well known in the art. For convenience of understanding, conductors 90, 92, 95 are hatched.

The devices formed in semiconductor islands 14D-E may be especially compact because the lateral dimensions of islands 14D-E and isolation trenches 26A-C and refill materials 50 and 46A-C may be carefully and precisely controlled with the invented process. Other than small predetermined lateral undercut amount 36 and/or lateral oxidation amount 42 from layer 40, there is no encroachment into semiconductor islands 14D-E. Further the high quality of sidewalls 30 and freedom from defects introduced into islands 14D-E during island formation contribute to excellent device properties and good manufacturing yields. By adjusting the composition of isolation layers 40, 46 the stress induced in islands 14DE may be minimized. Techniques for refilling isolation trenches and controlling residual stress are described for example in U.S. Pat. No. 4,825,277 to R. Mattox et al., entitled "Trench Isolation Process and Structure," Serial No. 122,091 to B. Bergami et al., entitled "Multilayer Trench Isolation Process and Structure," and U.S. Pat. No. 4,791,073 to A. Nagy et al., entitled "Trench Isolation Means and Method" which are incorporated herein by reference.

It will be apparent to those of skill in the art that there has been provided a means and method for obtaining planarized isolation regions for semiconductor devices comprising a dielectric for electrical isolation, that the method is particularly adapted to very small structures where excellent dimensional control and process control are essential, that smaller structures can be fabricated thereby because lateral encroachment into the semiconductor islands during fabrication has been made small and utilized to advantage to protect the semiconductor islands from over-etching, that the invented process may be carried out at low temperatures so that the Dxt (Diffusivity x time) product is minimized, thereby minimizing migration of previously doped regions, that defect formation in the semiconductor islands is likewise reduced, and that the resulting isolation regions separate semiconductor islands of controlled dimensions and substantially undisturbed properties.

The method of the present invention has been described by way of examples particularly suitable for silicon semiconductor processing and bipolar transistors, but those of skill in the art will understand that the method may be applied to other combinations of materials and other device structures. Accordingly, it is intended to include in the claims which follows such variations as will occur to those of skill in the art based on the description herein.

I claim:

1. A process for forming one or more dielectric isolation regions for a semiconductor device, comprising:
   providing a semiconductor substrate having a principal surface;
   forming on the principal surface a first mask resistant to etching of the substrate and having one or more openings with edges extending to the surface where the dielectric isolation regions are desired;
   etching the substrate through the openings to form a trench extending into the substrate from the surface wherein the trench has a bottom spaced a vertical first distance from the surface and sidewalls located under the first mask a lateral second distance from the edges of the openings;
   forming a first dielectric on the bottom and sidewalls of the trench having an outer surface on the trench sidewalls substantially aligned with the mask edges and a first thickness less than the first distance;
   forming a second dielectric on the first dielectric and having a second thickness equal or greater than the first distance minus the first thickness;
   providing a second mask over the second dielectric having one or more closed regions corresponding to the openings of the first mask and located laterally within the openings of the first mask and laterally smaller than the first openings by at least the second thickness;
   removing at least a first portion of the second dielectric layer above the first mask while leaving at least a second portion of the second dielectric layer substantially filling the trench; and
   removing the second mask.

2. The process of claim 1 further comprising (i) prior to providing the second mask, forming a polycrystalline semiconductor layer over the second dielectric and having a third thickness and (ii) after providing the second mask removing portions of the polycrystalline semiconductor layer in open regions of the second mask.

3. The process of claim 2 wherein the step of removing portions of the polycrystalline semiconductor layer comprises leaving a first part of the polycrystalline semiconductor layer under closed regions of the second mask and a second part contiguous with the first part in open regions of the second mask immediately adjacent the closed regions.

4. The process of claim 1 wherein the first mask is also resistant to oxidation of the substrate.

5. The process of claim 1 wherein the step of forming the second dielectric comprises forming the second dielectric substantially conformally on the first dielectric and the first mask.

6. The process of claim 2 wherein the step of providing the polycrystalline semiconductor layer comprises providing a polycrystalline semiconductor layer having a third thickness less than the second thickness.

7. A process for forming a smoothly filled trench in a semiconductor device comprising:
   providing a substrate having a semiconductor surface disposed thereon;
   forming an etch resistant mask on said semiconductor surface, said etch resistant mask having open and closed regions that include edges extending to said semiconductor surface;
   etching said semiconductor surface through said open region to form a trench having a bottom at a first depth from said semiconductor surface and a sidewall extending to said semiconductor surface under said closed region of said etch resistant mask and inset at said semiconductor surface from said open region of said etch resistant mask by a first lateral amount;

forming a dielectric liner on said bottom and said sidewall of said trench having an outer surface substantially aligned with the edge of said open region of said etch resistant mask at said semiconductor surface and filling said trench and covering said semiconductor surface with a substantially conformal first dielectric material wherein a first portion of a combination of said dielectric liner and said first dielectric material extend vertically a first distance from said trench bottom at least equal to said first depth, a second portion of said combination of said dielectric liner and said first dielectric material extend vertically a second distance from said trench bottom larger than said first distance, and a third portion of said first dielectric material extends vertically a third distance above said semiconductor surface;

providing a mask protecting said first portion of said first dielectric material;

providing a polycrystalline semiconductor layer on said first material and thereafter removing a portion of said polycrystalline semiconductor layer above said third portion of said first dielectric material and above part of said second portion of said first dielectric material; and removing said third portion of said first dielectric material above said semiconductor surface and the part of said second portion of said first dielectric material by which said second distance exceeds said first distance.

* * * * *